United States Patent [19]

Fritze

[11] 4,387,348
[45] Jun. 7, 1983

[54] PHASE-CONTROLLED HIGH FREQUENCY OSCILLATOR

[75] Inventor: Bernd Fritze, Puchheim, Fed. Rep. of Germany

[73] Assignee: Rohde & Schwarz GmbH & Co. K.G., Fed. Rep. of Germany

[21] Appl. No.: 197,942

[22] Filed: Oct. 17, 1980

[30] Foreign Application Priority Data

Oct. 27, 1979 [DE] Fed. Rep. of Germany ....... 2943510

[51] Int. Cl.³ .............................................. H03L 7/10
[52] U.S. Cl. ......................................... 331/17; 331/25
[58] Field of Search ...................... 331/1 A, 17, 18, 25

[56] References Cited

U.S. PATENT DOCUMENTS 3,701,039 10/1972 Lang et al. ......................... 331/25 X
4,246,545 1/1981 Reisfeld ............................. 331/25 X

FOREIGN PATENT DOCUMENTS 1591994 1/1971 Fed. Rep. of Germany.
2354357 10/1973 Fed. Rep. of Germany.
2116267 7/1972 France.

Primary Examiner—Siegfried H. Grimm
Assistant Examiner—Edward P. Westin
Attorney, Agent, or Firm—Hill, Van Santen, Steadman, Chiara & Simpson

[57] ABSTRACT

A phase-controlled high frequency oscillator has a phase comparator for comparing the oscillator frequency to a reference frequency which comparator controls two direct current sources connected to a charging capacitor for supplying charge pulses to the charging capacitor which in turn generates a charge voltage which determines the frequency of the oscillator, which is voltage controlled. The control of the current sources is undertaken in such a manner that in the steady-state condition of the phase control loop, both current sources supply relatively short charge pulses of equal size and opposite polarity to the charging capacitor. An auxiliary circuit generates a correction current proportional to the integral of the difference between the charge pulses supplied by the two current sources and is connected to the charging capacitor for further controlling the voltage controlled oscillator. The auxiliary circuit is designed such that only relatively short charge pulses generate a correction current.

8 Claims, 2 Drawing Figures

PHASE-CONTROLLED HIGH FREQUENCY OSCILLATOR

BACKGROUND OF THE INVENTION

1. Field of the Invention

The present invention relates to phase-controlled high frequency oscillators, and in particular to such oscillators wherein the oscillator is a voltage controlled oscillator having an input voltage determined by a charging capacitor connected to two direct current sources which in turn are controlled by the output of a phase comparison circuit which compares the oscillator frequency to a reference frequency.

2. Description of the Prior Art

Phase-controlled high frequency oscillators utilizing a voltage controlled oscillator which has an input control voltage determined by the voltage generated by a charging capacitor which is in turn supplied with current pulses from two separate current sources which are controlled by a phase comparison circuit which compares the oscillator frequency to a reference frequency are known in the art. The oscillator control voltage arising at the charging capacitor due to the current pulses supplied from the direct current sources is adjusted until the phase difference becomes zero. Instability is prevented by means of additional RC elements. In the ideal case, neither of the two current sources supplies a current pulse, given a zero phase difference. This ideal case, however, is not realizable because of variations of actual component values within tolerance ranges, and because of the finite switching times required by the current sources. In order to avoid a so-called "dead" range in which neither of the two current sources functions and in order thereby to avoid a constant oscillation of the oscillation frequency, it is preferable to control the current sources in such a manner that an overlap occurs, that is, in the steady-state condition of the phase control loop, both controlled current sources supply identical charge amounts of opposite polarity which mutually cancel. Such a circuit, however, still has fundamental disadvantages.

The current sources have residual currents which also flow in the off state of the current sources and which do not mutually cancel because the residual currents are not identical. Varactor diodes generally employed in voltage-controlled oscillators have reverse currents which can work to discharge the charging capacitor. Moreover, the oscillator may have a certain frequency drift which requires a constant recharging of the charging capacitor. Further, recharging phenomena can occur in the charging capacitor arising after each frequency change. These disruptive effects, as a result of which the difference of the rated and actual voltage at the charging capacitor is constantly changed, must be compensated in order to maintain the synchronous state by means of current pulses of constant width, or of a width which changes relatively slowly from the phase comparison circuit. By so doing, however, a disruptive frequency modulation of the oscillator results.

SUMMARY OF THE INVENTION

It is an object of the present invention to provide a phase-controlled high frequency oscillator which avoids the disadvantages in the steady-state condition described above, and most importantly wherein fluctuations due to residual currents from the current sources or reverse currents from the Varactor diodes are avoided without negatively influencing the noise characteristics of the oscillator.

In accord with the principles of the present invention, the above objects are inventively achieved in a phase-controlled high frequency oscillator having a voltage controlled oscillator which generates the oscillator frequency and having a phase comparator which compares the oscillator frequency with a reference frequency and in turn controls current sources which supply charge pulses to a charging capacitor for controlling the voltage controlled oscillator, further including an auxiliary circuit which generates a correction current which is proportional to the integral of the difference of the charge pulses supplied by the current sources, that is, the current is directly proportional in the steady-state condition to potential errors of the two mutually cancelling charge amounts in the ideal state. By the use of such an auxiliary circuit, the constant recharging current pulses across the phase comparison circuit which are required in conventional circuits for the compensation of such errors is avoided and the charge amount errors which may occur as a result of residual currents in the current sources or as a result of reverse currents of the Varactor diodes are compensated by the correction current. Because no additional circuit elements which may unfavorably influence the noise characteristics of the oscillator are necessary in the inventive circuit between the charging capacitor and the voltage controlled oscillator, the noise behavior of the oscillator control voltage is not negatively influenced.

DESCRIPTION OF THE PREFERRED EMBODIMENTS

Figure 1:
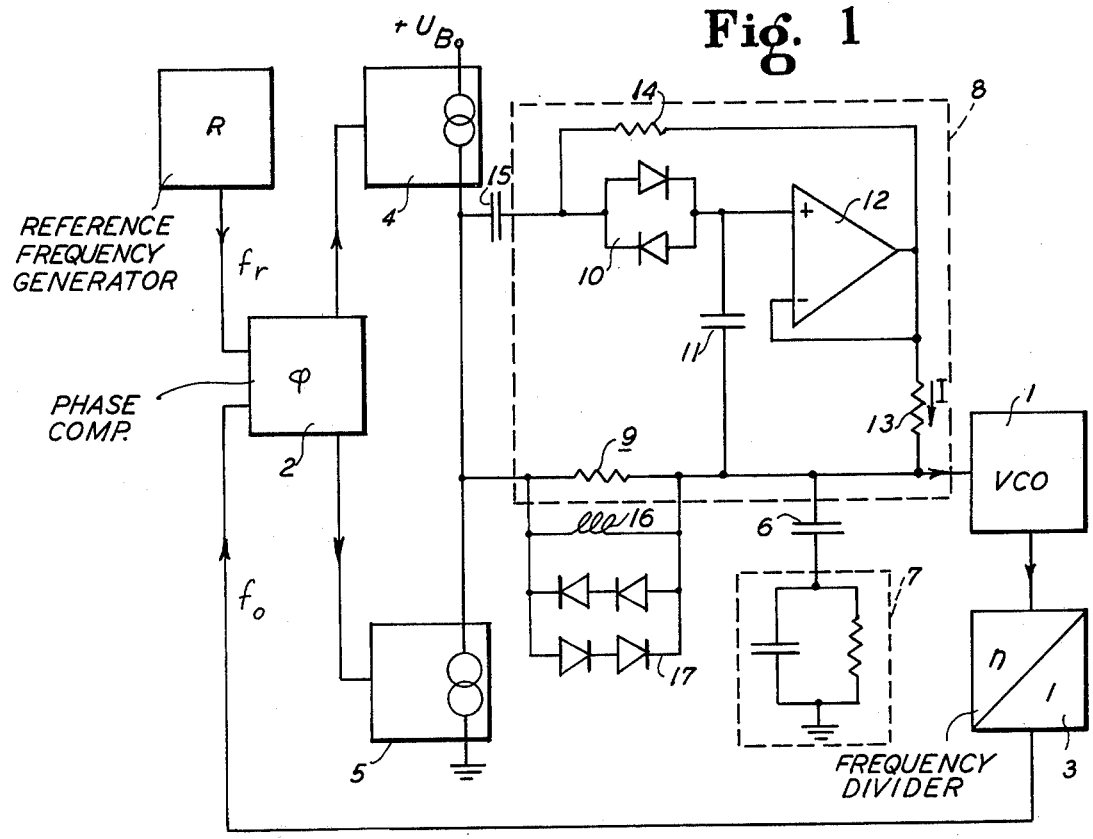
FIG. 1 is a schematic circuit diagram of a phase-controlled high frequency oscillator with a first embodiment of an auxiliary compensating circuit constructed in accordance with the principles of the present invention.

A phase-controlled high frequency oscillator is shown in FIG. 1 having an oscillator 1 which is frequency-controlled by the application of a D.C. voltage. The oscillator 1 has an output frequency $f_o$ which is compared in a phase comparator 2 with a reference frequency $f_r$ which is generated by a reference frequency generator R. The output frequency of the oscillator 1 may, for example, be changed in a known manner by means of an interconnected frequency divider 3 which may have an adjustable division ratio. Depending upon the phase position of the oscillator frequency $f_o$ with respect to the reference frequency $f_r$, the phase comparison circuit 2 supplies appropriate control pulses to a switchable positive direct current source 4 and to a correspondingly switchable negative direct current source 5. The current source 4 is connected to a positive voltage $U_B$, while the negative current source is connected to ground. The control pulses from the phase comparison circuit 2 are converted in the switchable current sources 4 and 5 into current pulses of corresponding pulse duration which are then supplied to a charging capacitor 6 in which the pulses are integrated to form the control voltage for the oscillator 1. The oscillator 1 may be tuned, for example, by Varactor diodes. In order to avoid instability, the charging capacitor 6 is connected in series to an RC circuit 7.

In accord with the invention, a correction direct current I is generated by an auxiliary circuit 8 enclosed in the dashed lines of FIG. 1. The correction direct current I is approximately proportional to the integral of the difference between the charge pulses supplied from the respective current sources 4 and 5. Additional circuit elements, described in greater detail below, insure that only relatively short charge pulses, which in the ideal state would mutually cancel one another, generate a corresponding correction current in the auxiliary circuit 8. The term "relatively short charge pulses" is used herein to designate such pulses as are attributed only to potential disruptions or to the overlap in the steady-state condition and which are relatively short in comparison to the charge pulses which occur as a result of deviation or fluctuation of the frequency $f_o$ in comparison to the reference frequency $f_r$. Such pulses which result from center frequency deviation have a duration, depending upon the particular design of the phase comparison circuit 2, which fluctuates between the period of the reference frequency $f_r$ (given a very large center frequency deviation) and substantially zero (for the steady-state condition in the ideal state). In contrast thereto, the "relatively short charge pulses" are pulses having a temporal width which amounts to approximately 0.1 percent of the period of the reference frequency $f_r$. This percentage value is, of course, not absolute and depends upon the dimensioning of the remainder of the components in the oscillator circuit.

In the first embodiment shown in FIG. 1, in the simplest case the auxiliary circuit 8 may consist of a resistor 9 connected between the mutually interconnected current sources 4 and 5 and the charging capacitor 6 at which a voltage drop occurs which is proportional to the difference between the current pulses supplied by the respective current sources 4 and 5. After rectification by the rectifiers 10, the voltage is integrated by a second capacitor 11 into a plurality of successive periods so that finally a voltage occurs at the auxiliary capacitor 11 which, under ideal conditions is proportional to the difference between the current pulses. By ideal conditions is meant the conditions wherein the two current sources 4 and 5 respectively supply current pulses of identical size and length in the quiescent state. As stated above, the current pulses would only be identical even in the steady-state condition when the current sources have no residual currents and when no reverse currents resulting from the Varactor diodes in the oscillator 1 are present to contribute to the voltage formed by the charging capacitor 6. When such residual currents or reverse currents exist, the charge pulses are no longer identical even in the steady-state condition, and the auxiliary circuit 8 generates a correction current I from such differences. The correction current I which is proportional to the voltage at the second capacitor 11 is generated by a unity-gain amplifier 12 with a very low input current by means of impedance transformation and is directly supplied to the charging capacitor 6 by a resistor 13. The charging current circuit for the rectifier diodes 10 is closed by a resistor 14 which is directly connected to the output of the amplifier 12. This insures that the rectifier diodes 10 are charged with a bias voltage which corresponds to the rectified output voltage of the amplifier 12. Thus, no quiescent voltage is present at the rectifiers 10 between the current pulses and the rectifiers therefore cannot generate an undesired residual current and moreover it is not necessary to supply constant pulses to the circuit for the compensation of self-generated residual currents.

The auxiliary circuit 8 is separated by a capacitor 15 from the current sources 4 and 5. The capacitor 15 has a relatively small capacitance value so that only relatively short charge pulses, such as occur as mutually overlapping pulses in the steady-state condition, are evaluated in the auxiliary circuit 8 for generating the residual current. This is expedient so that longer current pulses such as occur, for example, as a result of a frequency change and which it is desired should render as fast as possible a recharging of the charging capacitor 6 to the new frequency value, are not significantly considered in the auxiliary circuit 8. That is, given a frequency change by means of relatively long current pulses, the auxiliary circuit 8 retains the correction current previously generated in the steady-state condition, which is then directly utilized after termination of the frequency change. This is because one can make the valid assumption that errors due to residual currents or reverse currents occur relatively independently of the frequency, that is such errors as are present for a first frequency will also be present at the new frequency setting for the oscillator 1. The auxiliary circuit 8 thus does not supply correction currents which would disrupt the tuning operation for a frequency change.

The blocking of the auxiliary circuit 8 for relatively long switching pulses can be further improved as shown in FIG. 1 by the presence of an additional inductor 16 which insures that only relatively short current pulses generate a corresponding voltage drop and are evaluated in the auxiliary circuit 8, but allows relatively long pulses to be transmitted unimpeded to the capacitor 6. In the same manner, this separation effect between short and long pulses can be further improved by means of the interconnection of additional rectifiers 17 which, in comparison to the rectifiers 10 of the auxiliary circuit 8, have a relatively greater transmission voltage. Relatively short current pulses, therefore, first arrive at the rectifiers 10, and only when the higher forward voltage of the rectifier 17 is exceeded do longer current pulses, which occur as a result of frequency change, arrive at the charging capacitor 6 via the rectifier 17.

It was assumed in the embodiment shown in FIG. 1 that the two current sources 4 and 5 supply ideal current pulses of identical size as well as of identical length. This can usually not be achieved in practice. A further development of the circuit of FIG. 1 is shown in FIG. 2 which insures that such potential asymmetries of the current pulses are also compensated.

Figure 2:
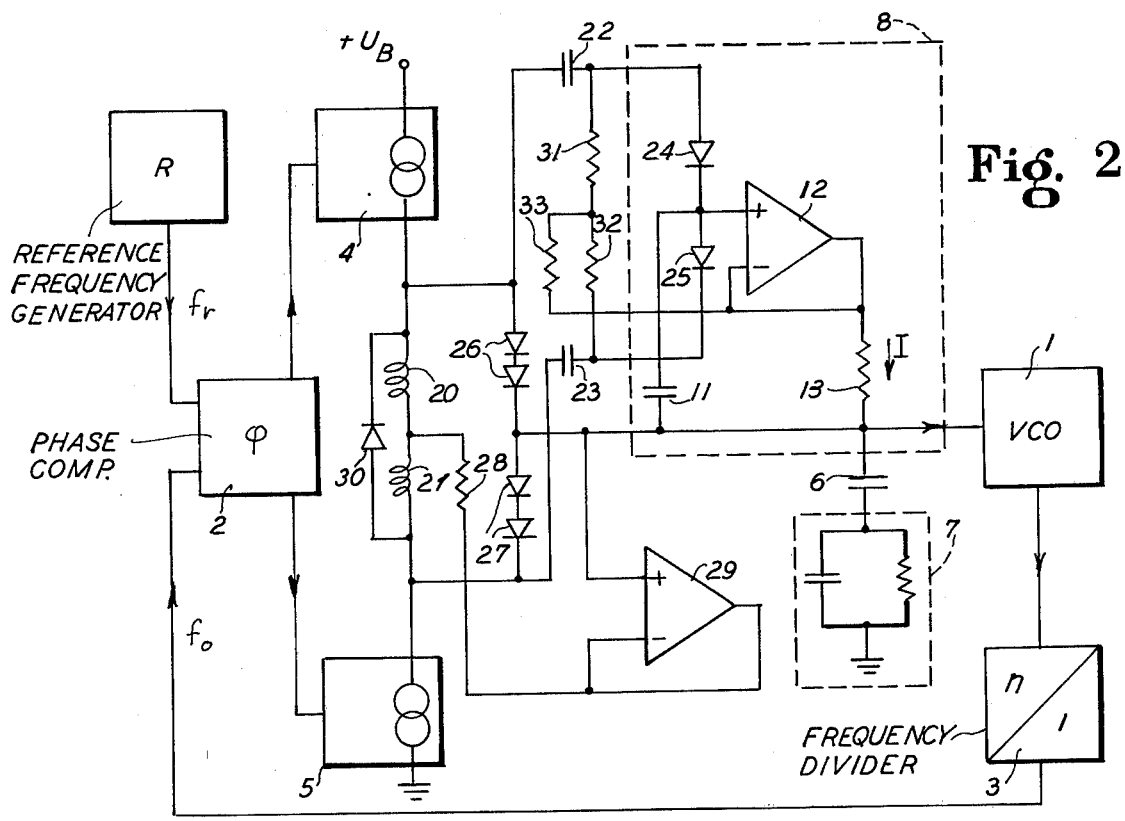
FIG. 2 is a schematic circuit diagram of a phase-controlled high frequency oscillator with a second embodiment of a compensating auxiliary circuit constructed in accordance with the principles of the present invention.

As shown in FIG. 2 the rectifiers 24 and 25 of the auxiliary circuit 8 are respectively separately driven by the current pulses from the two current sources 4 and 5. Two inductors 20 and 21 are connected at the outputs of the two current sources 4 and 5. Inductors 20 and 21 do not affect short current pulses which are supplied via separating capacitors 22 and 23 to the rectifiers 24 and 25. The inductors 20 and 21 have the effect that in the quiescent condition, that is between the individual current pulses, no voltages are present at the additional rectifiers 26 and 27 connected in parallel thereto and which have a higher forward voltage than the rectifiers 24 and 25. Symmetry is produced via a resistor 28 and an additional unity-gain amplifier 29. An additional rectifier 30 limits voltage pulses at the end of the current pulses. A voltage which is proportional to the integral of the difference of the current pulses from the two current sources 4 and 5 is again integrated by the second capacitor 11. Bias voltage resistors 31, 32 and 33 are allocated to the rectifiers 24 and 25. The resistor 33 is connected to the output of the amplifier 12 so that for every voltage present at the capacitor 11 it is insured that the voltage at the diodes 24 and 25 beyond the pulse time is equal to zero and therefore no residual currents flow through these circuit elements.

The separating capacitors 22 and 23 are dimensioned so that the capacitor 11 is not too greatly recharged upon the occurrence of a frequency change and thus longer current pulses from the current sources 4 and 5 flow only across the additional rectifiers 26 and 27. The inductor 21 may be eliminated if the resistor 28 has an appropriately high resistance value.

The circuit shown in FIG. 2 allows conduction of the entire charge of short pulses supplied by the current sources to the charging capacitor 6 via the second capacitor 11. Therefore, for short current pulses, the voltage change at the second capacitor 11 coincides with the voltage change at the charging capacitor 6 not only with respect to polarity, but also as to proportionality. In the aligned condition, that is for short current pulses, for example, the charge proceeds from the voltage source 4 via the separating capacitor 22 and the rectifier 24 to the second capacitor 11, and from the current source 5 analogously via the separating capacitor 23 and the rectifier 25 to the second capacitor 11. From the capacitor 11 the combined voltage is supplied to the charging capacitor 6. A positive or negative voltage for the duration of the short pulses arises at the diodes 26 and 27 during the charge pulses and the capacitors 22 and 23, which are first discharged, can thus conduct the charge pulses to the diodes 24 and 25. As long as the second capacitor 11 is discharged, the output voltage of the amplifier 12 is identical to the oscillator control voltage at the charging capacitor 6, so that no current flows across the resistor 13. This is the case as long as the positive and the negative charge pulses produce equal charge amounts. The separating capacitors 22 and 23 are quickly discharged across the resistor combination comprised of resistors 31, 32 and 33 after each pulse in such a manner that no voltage remains at the diodes 24 and 25. Therefore, no undesired residual current can reach the capacitor 11 via those diodes.

When the aligned or balanced condition is disrupted, for example, due to residual currents from one of the two current sources or from the Varactor diodes in the oscillator 1, the current pulses have different lengths. During a frequency change one pulse may temporarily entirely disappear. Because short current pulses are not conducted via the diodes 26 and 27, which have a higher transmission voltage, but rather are primarily conducted across the diodes 24 and 25, the capacitor 11 is charged and a current flows across the resistor 13. The current across the resistor 13 increases until the positive and negative current pulses are again of identical size. A false voltage at the capacitor 11 after a frequency change is compensated in the same manner, as is a potential oscillator drift or re-charging effect of the capacitor 6.

The amplifier 12 has a very low input current and may be, for example, a MOSFET amplifier having an input current which is less than the current of the blocked semiconductors by several magnitudes. It is also preferable that the capacitor 11 have good insulating properties. The noise from the amplifier 12 is decoupled from the control voltage at the capacitor 6 by the resistor 13. The time constant represented by the capacitor 6 and the resistor 13 is selected so large that noise interference no longer occurs. Moreover, the value of the resistor 13 is selected large in comparison to the resistor of the RC circuit 7.

The inventive circuit described above has the additional advantage that a potential step-wise detuning of the oscillator is converted into a continuous detuning. In phase-controlled high frequency oscillators of this type, for example, the reference frequency is often supplied from a synthesizer which is adjustable in decades with crystal frequency precision. The frequency divider 3 may also be adjustable in decades. The frequency of such oscillators is thus variable in very fine steps and, when the tuning of the synthesizer or of the frequency divider occurs over a number of decades via a suitable pulse control circuit, a so-called quasi-continuous, that is step-wise, tuning of the oscillator 1 is achieved in a predetermined frequency range. The presence of such relatively small frequency steps results in correspondingly short charge pulses from the current sources which, as described above, lead to the generation of a correction current via the auxiliary circuit 8. The oscillator 1 is therefore no longer adjusted in terms of its frequency by jumps or steps, but is instead continuously adjusted via the auxiliary current.

Although modification and changes may be suggested by those skilled in the art, it is the intention of the inventor to embody within the patent warranted hereon all changes and modifications as reasonably and properly come within the scope of his contribution to the art.

I claim as my invention:

1. In a phase-controlled high frequency oscillator having a voltage-controlled oscillator which generates an oscillator frequency, a reference frequency generator, a phase comparison circuit for comparing the phase of the oscillator frequency to the phase of the reference frequency, a pair of direct current sources controlled by said phase comparison circuit for generating charge pulses proportional to the phase difference determined by said phase comparison circuit which are supplied to a charging capacitor connected to said voltage controlled oscillator for supplying a control voltage thereto, whereby in the steady-state condition of the control loop both current sources generate charge pulses of equal size and opposite polarity having a duration which is substantially less than the period of said reference frequency, the improvement of:

an auxiliary circuit interconnected between said pair of current sources and said charging capacitor for generating a correction current proportional to the integral of the difference between the charge pulses generated by the current sources, said auxiliary circuit consisting of at least one circuit element connected to both of said current sources, a voltage drop being generated across said element corresponding to the charge pulses from said current sources, an integrating capacitor connected to said circuit element, at least one first rectifier interconnected between each of said current sources and said integrating capacitor such that said integrating capacitor is charged with said voltage drop, and an impedance transformer connected to said integrating capacitor for generating said correction current from the voltage across said integrating capacitor, whereby said auxiliary circuit generates said correction current only when said pulses from said current sources are charge pulses having a period which is less than the period of said reference frequency.

2. The oscillator of claim 1 wherein said auxiliary circuit is connected to each of said current sources through at least one separating capacitor having a small capacitance.

3. The oscillator of claim 1 further comprising at least one second rectifier interconnected between each of said current sources and said charging capacitor, said second rectifier having a greater forward voltage than said first rectifier.

4. The oscillator of claim 1 wherein said improvement further comprises two said circuit elements for respectively generating a voltage drop for each of said current sources, a pair of separating capacitors and wherein said auxiliary circuit further comprises two additional rectifiers, each of said circuit elements and each of said current sources being interconnected with said integrating capacitor through one of said separating capacitors and respective ones of said two additional rectifiers.

5. The oscillator of claim 4 wherein said circuit elements are inductors.

6. The oscillator of claim 1 wherein said impedance transformer is an amplifier having an input side connected to said integrating capacitor and having an output side connected to said charging capacitor through a resistor.

7. The oscillator of claim 6 wherein said first rectifier and said two additional rectifiers are biased via resistor means connected to said output of said amplifier.

8. The oscillator of claim 4 wherein said pair of separating capacitors and said two additional rectifiers interconnected between said current souces and the integrating capacitor have a selected forward voltage for transmitting longer current pulses through said two additional rectifiers to said integrating capacitor.

* * * * *